United States Patent
Moshe

(10) Patent No.: US 11,167,908 B2
(45) Date of Patent: Nov. 9, 2021

(54) SECURING MECHANISM FOR CASING FOR TRANSPORTING COMMUNICATIONS COMPUTERS AND ELECTRONICS RACKS

(71) Applicant: Doron Moshe, Rishon Lezion (IL)

(72) Inventor: Doron Moshe, Rishon Lezion (IL)

( * ) Notice: Subject to any disclaimer, the term of this patent is extended or adjusted under 35 U.S.C. 154(b) by 0 days.

(21) Appl. No.: 17/204,974

(22) Filed: Mar. 18, 2021

(65) Prior Publication Data

US 2021/0198025 A1 Jul. 1, 2021

Related U.S. Application Data

(63) Continuation-in-part of application No. 16/686,149, filed on Nov. 17, 2019, now abandoned.

(30) Foreign Application Priority Data

Nov. 28, 2018 (IL) .......................................... 263352

(51) Int. Cl.
*B65D 81/05* (2006.01)
*H05K 7/18* (2006.01)

(52) U.S. Cl.
CPC .............. *B65D 81/05* (2013.01); *H05K 7/186* (2013.01)

(58) Field of Classification Search
CPC .... H05K 7/186; H05K 7/1489; H05K 7/1497; H05K 5/0008; H05K 5/0234; B65D 81/05
See application file for complete search history.

(56) References Cited

U.S. PATENT DOCUMENTS

| | | | | |
|---|---|---|---|---|
| 5,372,262 A * | 12/1994 | Benson | ................... | A47B 47/02 211/189 |
| 5,626,231 A * | 5/1997 | Kwong | ................... | B65D 19/14 108/54.1 |
| 5,644,991 A * | 7/1997 | Prevot | .................... | B65D 19/40 108/54.1 |
| 5,842,424 A * | 12/1998 | Prevot | ................ | B65D 19/0026 108/54.1 |
| 5,911,179 A * | 6/1999 | Spiczka | .................. | B65D 19/44 108/51.11 |
| 6,515,225 B1 * | 2/2003 | Wright | ................... | H05K 7/186 174/50 |
| 7,699,180 B2 * | 4/2010 | Mollard | ............... | H05K 5/0234 211/26 |
| 7,978,463 B1 * | 7/2011 | Haun | ...................... | H05K 7/186 361/679.01 |
| 8,251,467 B2 * | 8/2012 | Peng | ..................... | H05K 5/0234 312/351.1 |
| 8,371,666 B2 * | 2/2013 | Wu | ....................... | H05K 7/1497 312/334.28 |
| 8,419,328 B2 * | 4/2013 | Hsiao | ................... | H05K 7/1497 410/87 |

(Continued)

FOREIGN PATENT DOCUMENTS

DE 19811761 C1 * 8/1999 ............. H05K 7/186

*Primary Examiner* — Stanton L Krycinski

(57) ABSTRACT

A casing for transporting a communication rack that includes a bottom plate, four side walls, a top side, and a securing mechanism that includes front and back beams and right and left brackets. Each beam has left and right ends with horizontal holes and each bracket has front and back ends with pieces with threaded hole. The front beam is connected onto a top side of the front margin of the bottom plate and the back beam is connected onto a top side of a back margin of the bottom plate.

1 Claim, 4 Drawing Sheets

(56) References Cited

U.S. PATENT DOCUMENTS

| | | | | |
|---|---|---|---|---|
| 8,599,540 B2* | 12/2013 | Fernandez | ............. | H05K 7/186 |
| | | | | 361/679.01 |
| 8,602,701 B2* | 12/2013 | Hsiao | ................... | H05K 7/1495 |
| | | | | 410/87 |
| 8,804,341 B2* | 8/2014 | Hsiao | ..................... | B65D 81/05 |
| | | | | 361/727 |
| 9,676,517 B2* | 6/2017 | Jiang | .................... | H05K 7/1488 |
| 9,686,882 B2* | 6/2017 | Bailey | .................. | H05K 7/1488 |
| 9,809,146 B2* | 11/2017 | Myers | ................ | B65D 90/0053 |
| 10,129,992 B2* | 11/2018 | Xiao | ....................... | A47B 91/08 |
| 10,219,404 B2* | 2/2019 | Kobayashi | ........... | H05K 7/1497 |
| 10,343,814 B2* | 7/2019 | Ziemer | .................. | B65D 61/00 |
| 10,480,200 B2* | 11/2019 | Kobayashi | ........ | E04F 15/02417 |
| 10,765,025 B2* | 9/2020 | Clements | ............. | H05K 5/0226 |
| 10,800,599 B1* | 10/2020 | Moshe | ................ | B65D 81/127 |
| 10,981,695 B2* | 4/2021 | Jiang | ................ | B65D 19/0012 |
| 2004/0263035 A1* | 12/2004 | Lim | ........................ | F25D 23/00 |
| | | | | 312/351.1 |
| 2006/0086881 A1* | 4/2006 | Miller | ................. | A47B 91/005 |
| | | | | 248/346.01 |
| 2006/0232174 A1* | 10/2006 | Muth | ..................... | A47B 53/02 |
| | | | | 312/198 |
| 2011/0284711 A1* | 11/2011 | Hsiao | ................... | B65D 19/38 |
| | | | | 248/346.03 |
| 2012/0104918 A1* | 5/2012 | Peng | .................... | H05K 7/1497 |
| | | | | 312/334.27 |
| 2012/0104920 A1* | 5/2012 | Peng | .................... | H05K 7/1497 |
| | | | | 312/334.28 |
| 2016/0157385 A1* | 6/2016 | Chan | ................. | H05K 7/20745 |
| | | | | 312/236 |

\* cited by examiner

SECURING MECHANISM FOR CASING FOR TRANSPORTING COMMUNICATIONS COMPUTERS AND ELECTRONICS RACKS

RELATED APPLICATIONS

This application is a continuation in part application of a U.S. patent application Ser. No. 16/686,149 filed on Nov. 17, 2019 that claims the benefit of priority of IL Patent Application No. 263352 filed on Nov. 28, 2018.

TECHNICAL FIELD

The present invention relates to a securing mechanism for casings for transporting communications computers and electronics racks.

BACKGROUND ART

Israeli patent number 246517 which is also published as PCT/IL2017/050710 describes a casing for transporting communications computers and electronics racks ("communication racks"). That casing and other casings (100) known in the art are usually includes a heavy metal bottom plate (200) on which the communication rack (300) is positioned and secured, four wooden side walls (400), and a wooden top side (500). The four side walls and the top plate are usually made of wooden plates.

Communication racks are very expensive items, very sensitive when they fall and in many cases very heavy. For example, there are communications racks of 200 cm height, 90 cm long, 60 cm wide, weighing between 200 and 2,500 kg and in a value of between One Hundred Thousands to Two million USD. Sometimes it is necessary to transport the communication rack in a standing position, and as a result it is unstable due to its weight and a relatively high center of gravity. It is customary to pack the communications racks in a wooden casing, to transport it from the manufacturer to the customer, and sometimes it is transported between countries in containers on ships.

It is known in the art that it is highly important to secure the communications racks (300) to the bottom plate (200) in order to prevent the communications racks to fall and lean on the inner side of the side walls (400) of the casings while in transport (on a sheep, track or a train). In such cases, the high weight of the communication rack and the shaking of the road may cause the side wall to collapse together with the communication rack and to causes an enormous financial damage.

The manufacturers usually use professional people for packing the communications racks and they make sure to secure them to the bottom plates. However, sometimes the customers are supposed to return the communications racks back to the manufacturers, and the customer's employees are not aware of the security importance or are not aware that the bottom plate includes elements of security, and as a result they pack the communications racks inside the casings without securing them to the heavy bottom plates. FIG. 1 depicts the casing (100) in a closed state. FIG. 2 is an exploded depiction the casing (100). FIG. 3 depicts the bottom plate (200) with a couple of securing elements (600). The communication rack is positioned between these two securing elements (600) and the professionals who pack the rack insert two screws in each side through the holes (601) into the communication rack itself and by that securing it to the bottom plate.

It is clear that there is a need for a securing mechanism in a structure that will disable the employees to forget to secure the communications racks to the bottom plates. The present invention discloses an efficient and relatively inexpensive solution to the problem mentioned above.

DESCRIPTION OF THE DRAWINGS

The intention of the drawings attached to the application is not to limit the scope of the invention and its application. The drawings are intended only to illustrate the invention and they constitute only one of its many possible implementations.

THE INVENTION

Figure 1:
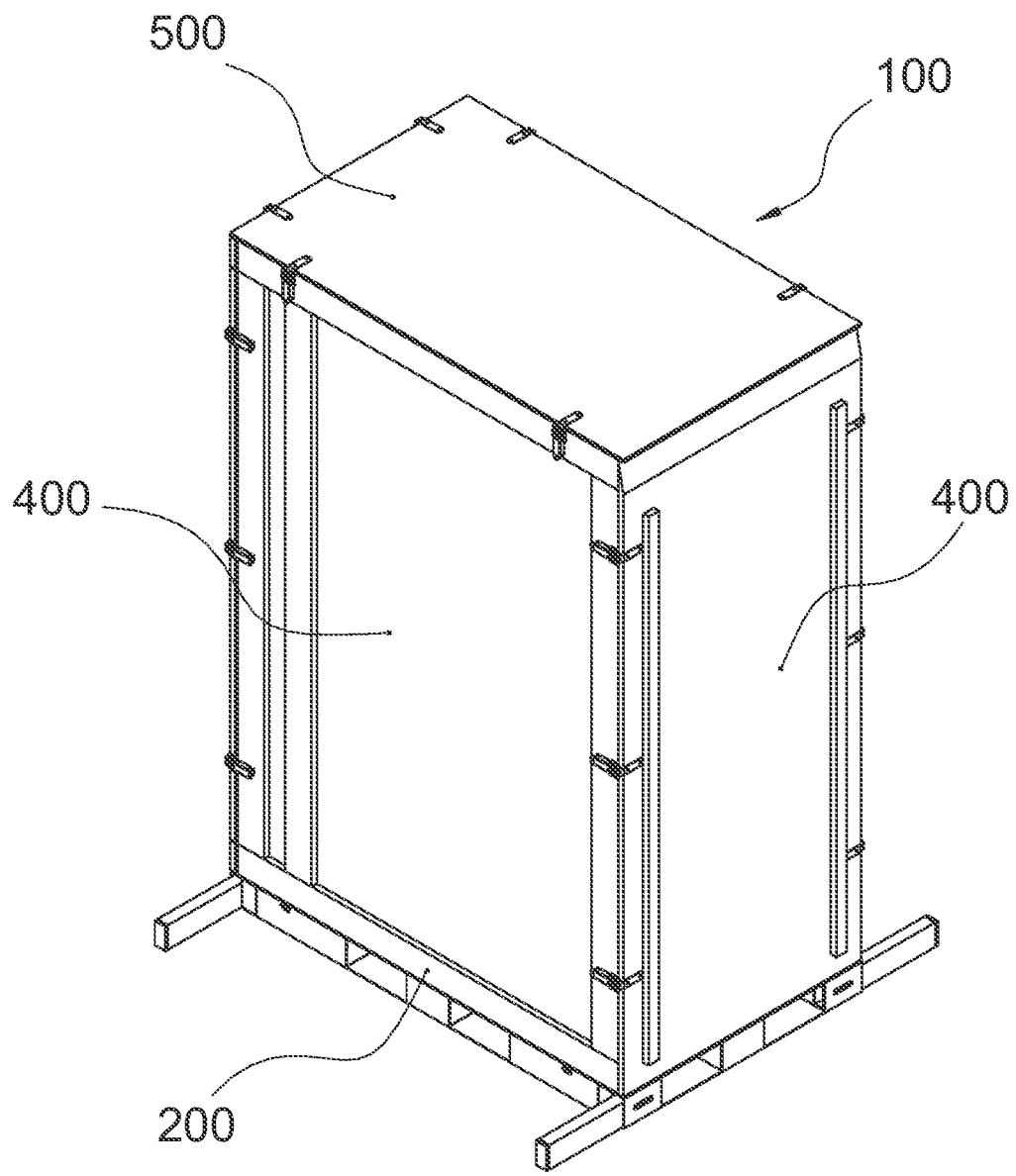
FIG. 1 depicts the casing (100) in a closed state.
Figure 2:
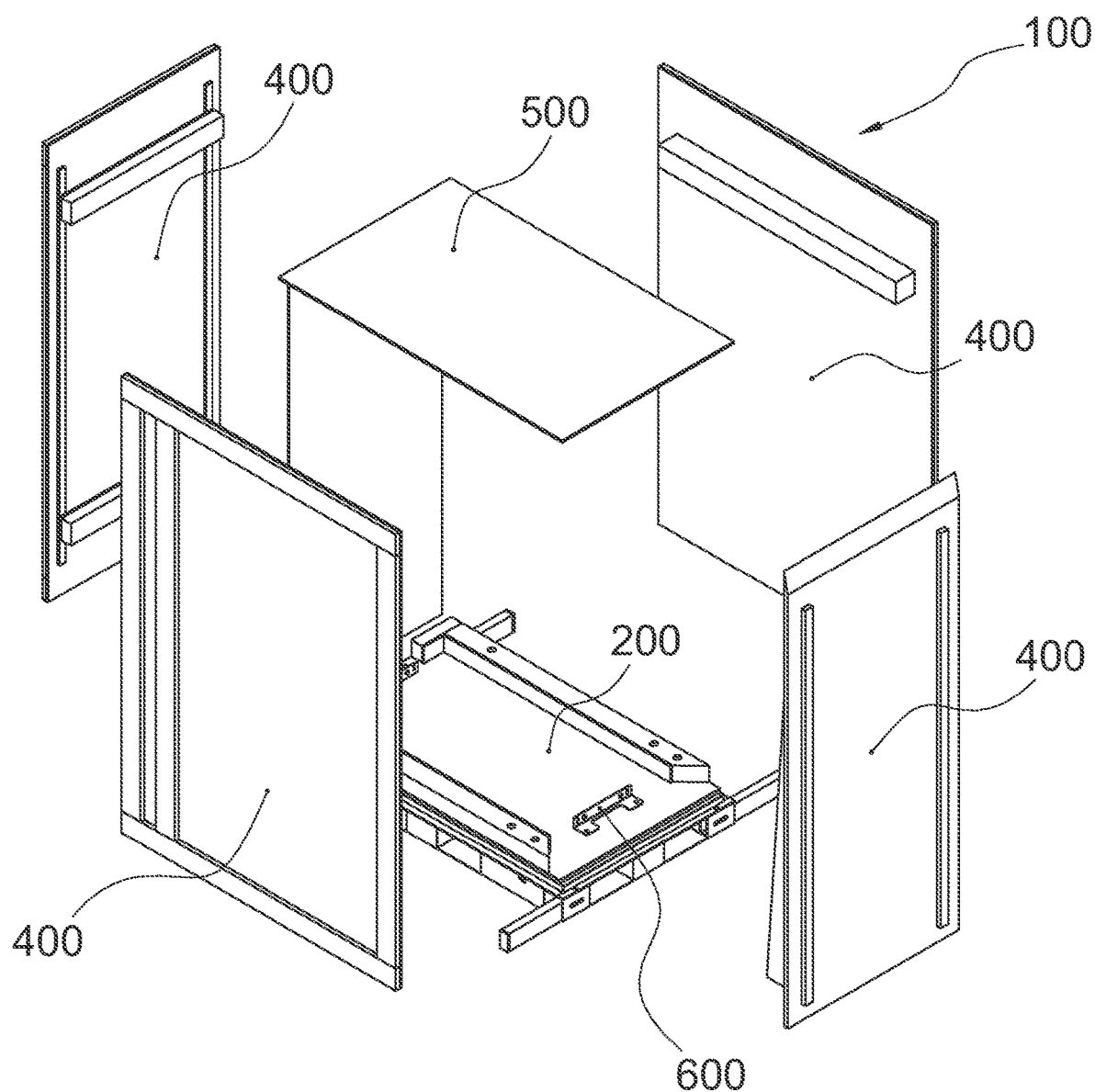
FIG. 2 is an exploded depiction the casing (100).
Figure 3:
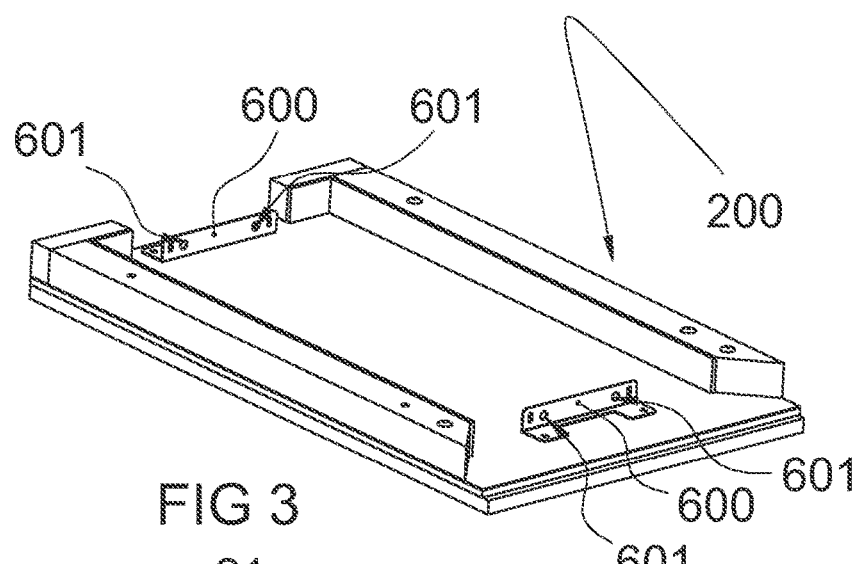
FIG. 3 depicts the bottom plate (200) with a couple of securing elements (600).

The main objective of the present invention is to provide a casing (100) for transporting a communications rack (300) that includes a securing mechanism (1) for securing the communication rack to the bottom plate (200) of the casing. In addition, the objective of the present invention is to provide said securing mechanism (1) and a method of securing a communication rack to the bottom plate (200) of the casing (100).

The casing (100) includes a bottom plate (200) on which the communication rack (300) is positioned and secured, four side walls (400), a top side (500) and a securing mechanism (1). The four side walls (400) are usually wooden plates and together with the top and the bottom plate they create a rectangular box in which the communication rack is positioned. The bottom plate (200) is usually made of a heavy metal and the side walls (400) are aimed to be attached to its four sides for creating the rectangular box. It is preferably that the bottom plate (200) will be made of metal, and as a result it lowers the center of gravity of the casing and increases the stability of the casing.

Figure 4:
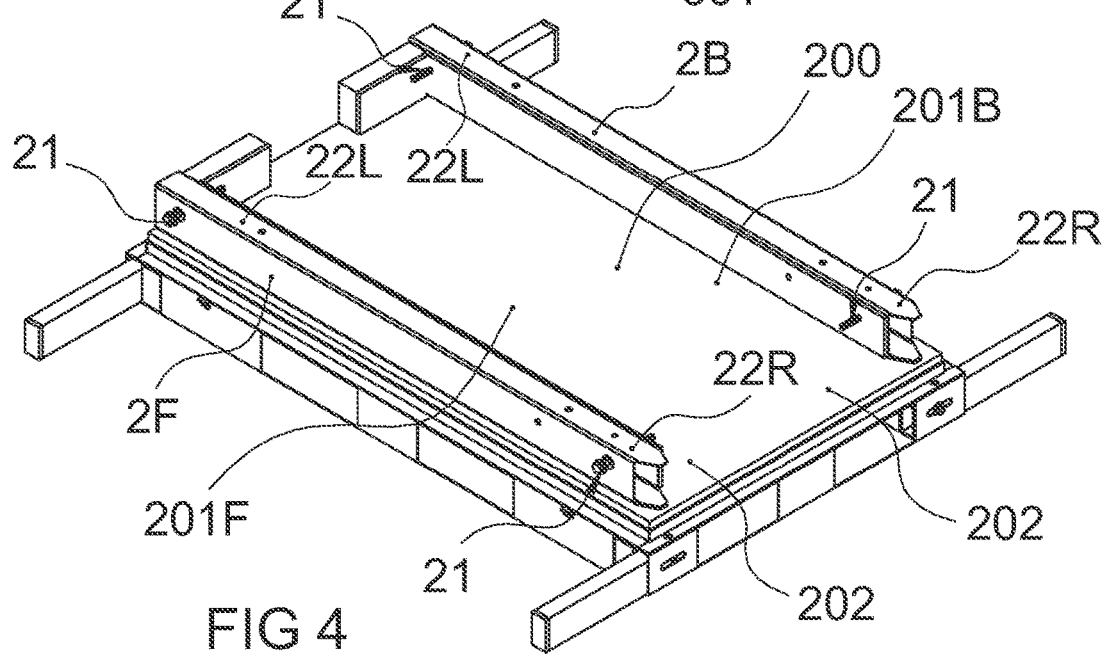
FIG. 4 depicts the beams (2) as connected to the bottom plate (200).
Figure 6:
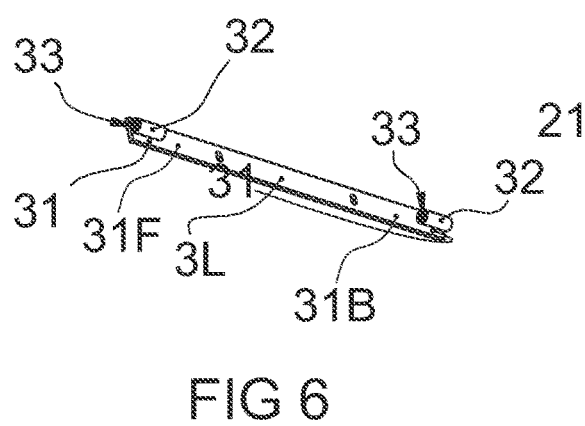
FIG. 6 depicts the supporting bracket (3).
Figure 5:
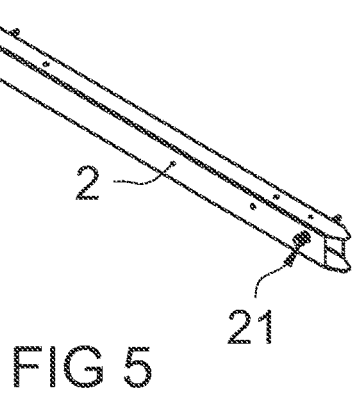
FIG. 5 depicts the beam (2) with two holes (21).

The securing mechanism (1) includes two beams (2) and two supporting brackets (3). The beams (2) are connected to the upper side (201) of the bottom plate (200) near two of its opposite margins (202). Each beam (2) includes two holes (21). The supporting brackets (3) are connected to two opposite side walls (301) of the communication rack (300) near its bottom. Each end (31) of the supporting bracket (3) includes a piece (32) with a threaded hole (33). FIG. 4 depicts the beams (2) as connected to the bottom plate (200), FIG. 5 depicts the beam (2) with two holes (21) and FIG. 6 depicts the supporting bracket (3).

Figure 7:
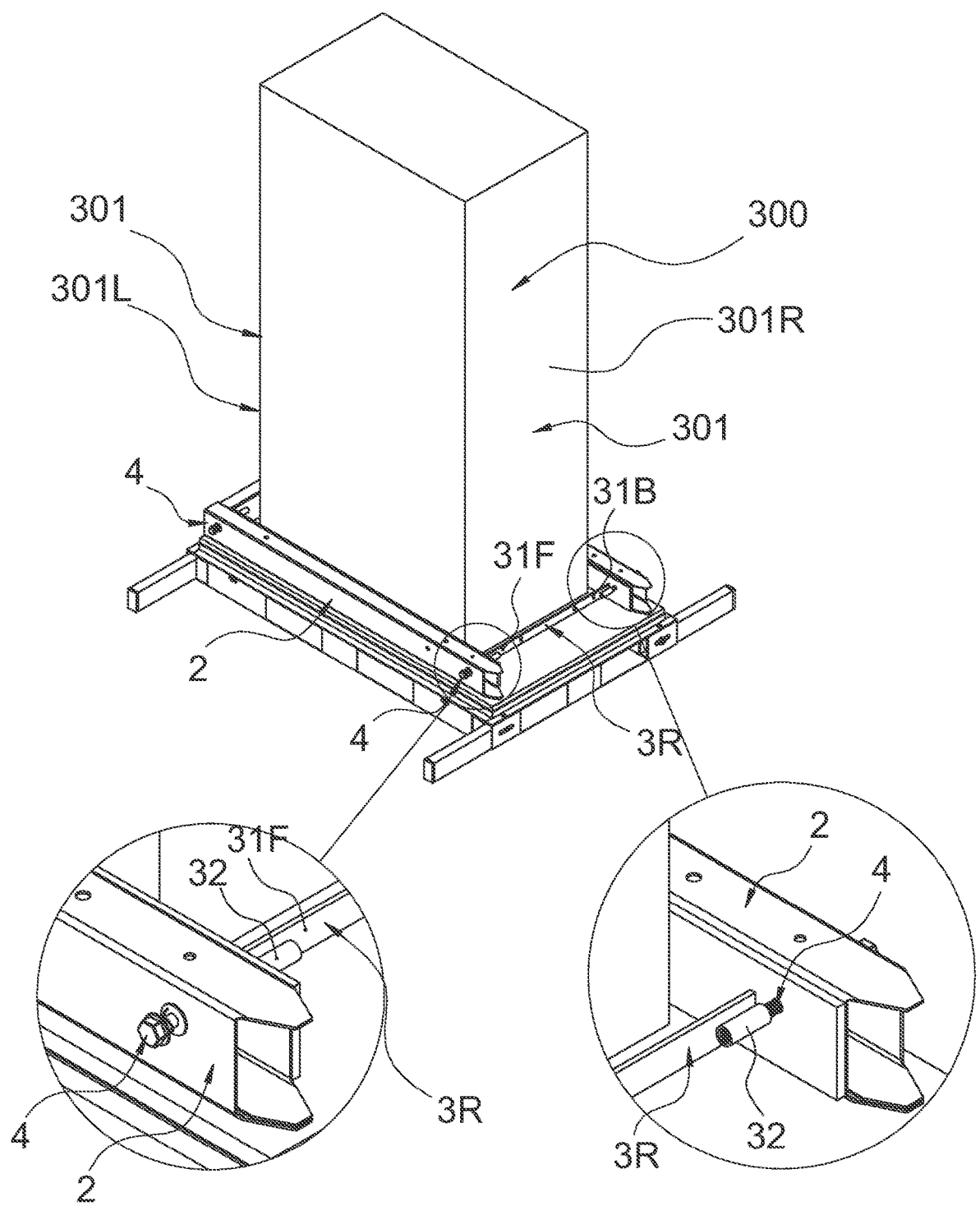
FIG. 7 depict the communication rack (300) secured to the bottom plate (200).

After positioning the communication rack (300) on the bottom plate (200) between the beams (2) the user that pack the communication rack (300) inside the casing (100) screw four screws (4) that pass through the holes (21) in the beams (2) into the threaded hole (33) in the supporting bracket (3) as depicted for example in FIG. 7. It is understood that the supporting brackets (3) should be attached to the communication rack (300) in a way that their threaded hole (33) will face the holes (21) of the beams (2).

The four screws (4) are supposed to be inserted into the holes (21) of the beams (2) and to remain there permanently, possibly by a spring and a ring that will prevent their removal from the beams by mistake. When the communication rack is placed on the bottom plate (200) between the two beams (2), the four screws (4) are pushed out and prevent the user from attaching at least two of the side walls (400) to the bottom plate (200), but only after the user screws the four screws (4) into the threaded hole (33) in the supporting bracket (3). In this way, even a person who did not receive instructions on the casing (100) will understands that these four screws (4) must be screwed into the supporting bracket (3) and in any way he or she will be disable to pack the rack without screwing these four screws and securing the rack to the bottom plate.

The present patent application also refers to the method for securing the communication rack to the bottom plate (200) of the casing (100) that includes the following steps and components: Providing the securing mechanism (1), connecting the beams (2) to the upper side (201) of the bottom plate (200) and connecting the supporting brackets (3) to two side walls (301) of the communication rack (300).

In other words the present inventions discloses a casing (100) for transporting a communication rack (300) that comprises a bottom plate (200), four side walls (400), a top side (500), and a securing mechanism (1) for securing the communication rack to the bottom plate. The securing mechanism (1) comprises a front beam (2F), a back beam (2B), a right bracket (3R), and a left bracket (3L). The front beam has a left end (22L) with a horizontal hole (21) and a right end (22R) with a horizontal hole (21), and the back beam also has a left end (22L) with a horizontal hole (21) and a right end (22R) with a horizontal hole (21).

The right bracket has a front end (31F) with a piece (32) that has a threaded hole (33) and a back end (31B) with a piece (32) that has a threaded hole (33), and the left bracket also has a front end (31F) with a piece (32) that has a threaded hole (33) and a back end (31B) with a piece (32) that has a threaded hole (33). The front beam (2F) is connected onto a top side of a front margin (201F) of the bottom plate (200), and the back beam (2B) is connected onto a top side of a back margin (201B) of the bottom plate (200). The communication rack is designed to be positioned between the front beam and the back beam such that said beams embrace two opposite side walls of the communication rack.

The piece at the back end of the left bracket is designed to be connected by a screw to the hole at the left end of the back beam; the piece at the front end of the left bracket is designed to be connected by a screw to the hole at the left end of the front beam; the piece at the back end of the right bracket is designed to be connected by a screw to the hole at the right end of the back beam; and the piece at the front end of the right bracket is designed to be connected by a screw to the hole at the left end of the front beam.

At least one of said brackets is designed to be connected to a side wall (301) of the communication rack. When the right bracket (3R) is connected to the communication rack then it can be connected to the right side (301R) of the communication rack (300), and when the left bracket (3L) is connected to the communication rack then it can be connected to the left side (301L) of the communication rack (300).

What is claimed is:

1. A casing for transporting a communication rack that comprises a bottom plate, four side walls, a top side, and a securing mechanism for securing the communication rack to the bottom plate;
    wherein said securing mechanism comprises a front beam, a back beam, a right bracket, and a left bracket;
    wherein the front beam has a left end with a horizontal hole and a right end with a horizontal hole, and wherein the back beam has a left end with a horizontal hole and a right end with a horizontal hole;
    wherein the right bracket has a front end with a piece that has a threaded hole and a back end with a piece that has a threaded hole, and wherein the left bracket has a front end with a piece that has a threaded hole and a back end with a piece that has a threaded hole;
    wherein the front beam is connected onto a top side of a front margin of the bottom plate, and wherein the back beam is connected onto a top side of a back margin of the bottom plate, wherein the communication rack is designed to be positioned between the front beam and the back beam such that said beams embrace two opposite side walls of the communication rack;
    wherein the piece at the back end of the left bracket is designed to be connected by a screw to the hole at the left end of the back beam; wherein the piece at the front end of the left bracket is designed to be connected by a screw to the hole at the left end of the front beam;
    wherein the piece at the back end of the right bracket is designed to be connected by a screw to the hole at the right end of the back beam; wherein the piece at the front end of the right bracket is designed to be connected by a screw to the hole at the left end of the front beam;
    wherein at least one of said brackets is designed to be connected to a side wall of the communication rack; wherein when the right bracket is connected to the communication rack then it can be connected to the right side of the communication rack, and when the left bracket is connected to the communication rack then it can be connected to a left side of the communication rack.

* * * * *